United States Patent [19]

Best

[11] 4,390,987

[45] Jun. 28, 1983

[54] MULTIPLE INPUT MASTER/SLAVE FLIP FLOP APPARATUS

[75] Inventor: David W. Best, Marion, Iowa

[73] Assignee: Rockwell International Corporation, El Segundo, Calif.

[21] Appl. No.: 283,265

[22] Filed: Jul. 14, 1981

[51] Int. Cl.³ .................. H04J 3/02; H03K 17/00
[52] U.S. Cl. .................. 370/112; 328/154; 328/191; 328/207; 307/243
[58] Field of Search .............. 370/112; 328/139, 137, 328/154, 191, 207; 307/241, 242, 243

[56] References Cited

U.S. PATENT DOCUMENTS 3,969,638 7/1976 Marchetti et al. .............. 370/112
4,032,795 6/1977 Hale .............................. 307/241
4,215,615 8/1980 Holzmann et al. .............. 328/137

Primary Examiner—Douglas W. Olms
Attorney, Agent, or Firm—Bruce C. Lutz; Howard R. Greenberg; H. Fredrick Hamann

[57] ABSTRACT

The typical gating means (four) in a master/slave flip flop are duplicated for each input signal to be multiplexed through the flip flop and a separate control signal is applied to each set of four gating means for determining which of the plurality of input signals is to be passed through the flip flop. While for a single flip flop there is no advantage in reduction of components, when the flip flop is used as one of a plurality of flip flops such as in a register, the reduction of components (used for multiplexing) is very significant.

8 Claims, 2 Drawing Figures

MULTIPLE INPUT MASTER/SLAVE FLIP FLOP APPARATUS

INVENTION

The present invention is generally related to electronics and more specifically related to master/slave flip flops or memory elements. Even more specifically, the present invention is related to multiplexing signals through a master/slave flip flop where the flip flop is to be part of a register array of master/slave flip flops in a state machine.

When it has been desired to select from two or more signals to be passed through a master/slave flip flop in the prior art, a multiplexer has been used for the data signals of each of the master/slave flip flops involved. The multiplexer decodes the select line signals to determine which of the plurality of input signals is to be passed to a simple master/slave flip flop. Due to the delays in the selection process of the multiplexer, the clock signal needed to be delayed to compensate for the time delays in the selection process. Where a large number of such flip flops were used in a array such as a register which register is to receive logic bit signals from one of a plurality of words, the number of transistors involved in the multiple multiplexers became quite significant.

The present invention increases the number of gates in each master/slave flip flop so that there are n times as many as the normal number of gating means where n is the number of data input or controlled signals to choose from. A separate select or control line is used for each of the multiple inputs and the select line actuates a set of gating means within the master/slave flip flop. At first glance, this unnecessarily complicates the circuitry involved in the master/slave flip flop but in one application of the present invention where there were sixteen stages of flip flops in each of several registers to select from one of two input words, 184 transistors were saved per register by using the present invention as opposed to the prior art approach.

In view of the above, it is an object of the present invention to provide an improved multiplexing master/slave flip flop circuit configuration.

Other objects and advantages of the present invention will be apparent from a reading of the specification and appended claims in conjunction with the drawings wherein:

FIG. 1 is a presentation of the prior art approach to multiplexing signals through a master/slave flip flop; and FIG. 2 presents a circuit diagram of the present inventive approach to multiplexing signals through a master/slave flip flop.

DETAILED DESCRIPTION

Figure 1:
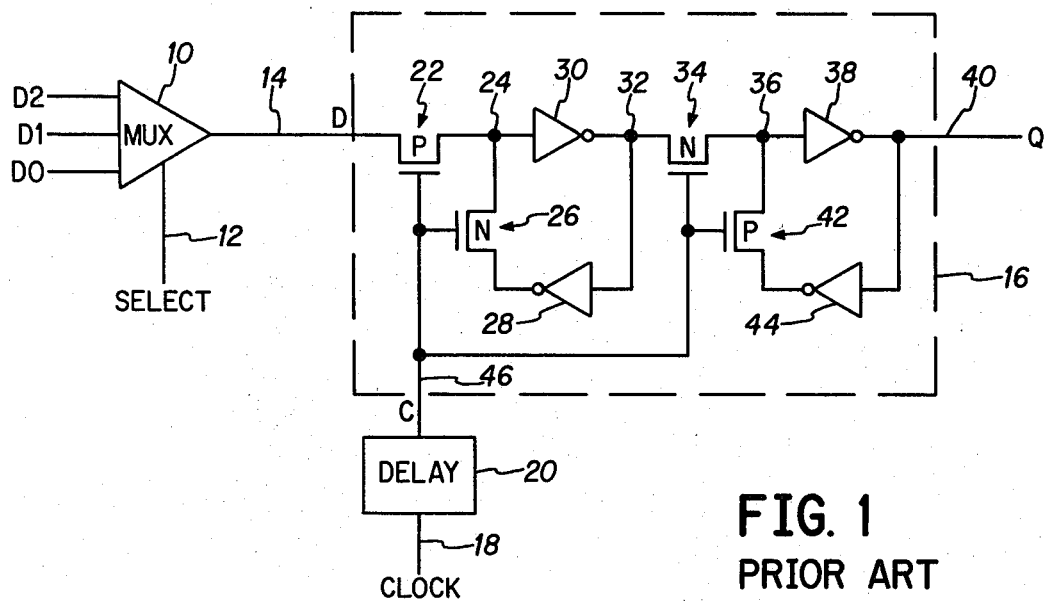

In FIG. 1 a multiplexer 10 receives signals D0, D1 and D2 and receives a plurality of logically different select signals on lead 12. An output of multiplexer 10 supplies the selected signal from between D0 through D2 on a lead 14 to a dash line block or master/slave flip flop 16 having a D input. Clock signals are supplied on a lead 18 through a delay block 20 to a clock input labeled C in block 16. A P channel FET transistor or gating means 22 is connected between the D input of lead 14 and a junction point 24. A N channel FET transistor or gating means 26 is connected between junction 24 and an output of an inverter 28. An inverter 30 is connected between junction point 24 and a junction point 32 which also serves as an input to inverter 28 and is connected to one lead of an N channel FET transistor or gating means 34 which has it other lead connected to a junction point 36. An inverter 38 is connected between point 36 and an output lead 40 which is also labeled Q as the Q output of the flip flop 16. A P channel FET transistor or gating means 42 is connected in series with an inverter 44 between lead 40 and junction point 36. A lead 46 is connected to the C input or clock input and is connected to the control or gate of each of the FETs 22, 26, 34 and 42.

Figure 2:
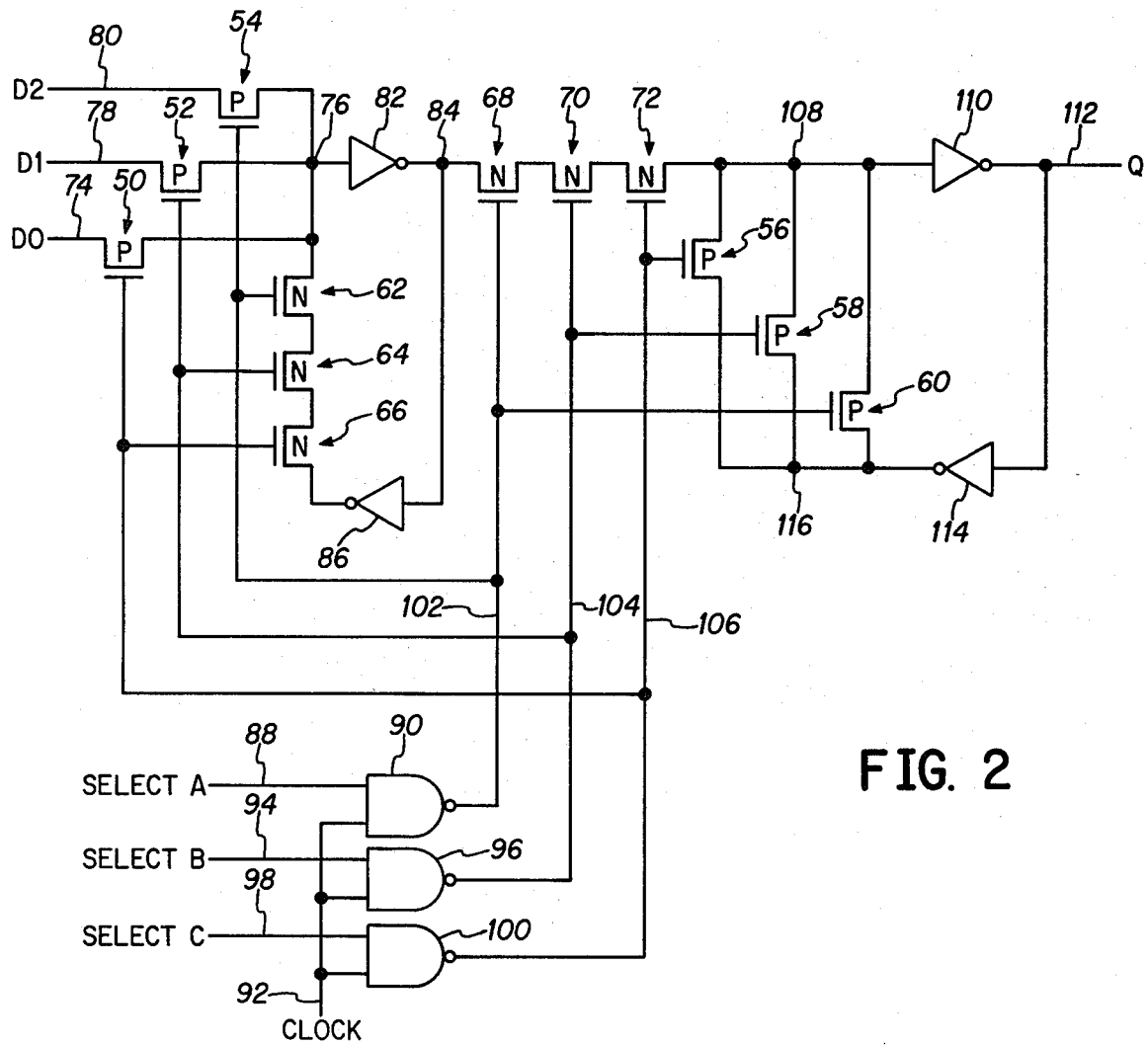

In FIG. 2 a plurality of P channel FETs, controlled switches or gating means 50, 52, 54, 56, 58, and 60 are illustrated. In addition, a plurality of N channel FETs, controlled switches or gating means 62, 64, 66, 68, 70, and 72 are illustrated. P channel transistor 50 is connected between a data input lead D0 also labeled as 74 and a junction point 76. Gating means 52 is connected between D1 input lead 78 and junction point 76. Gating means 54 is connected between D2 input lead 80 and junction point 76. An inverter 82 is connected between junction point 76 and a junction point 84. P channel transistors 50 through 54 comprise the input section of the master stage of the master/slave flip flop of FIG. 2. An inverter 86 is connected between junction point 84 and one lead of N channel transistor 66 which is serially connected with transistors 64 and 62 to junction point 76. Transistors 62 through 66 comprise a serial connection of transistors in the feedback section of the master stage of the master/slave flip flop. The master stage of the master/slave flip flop includes both the input section of gates 50 through 54, the inverters 82 and 86 as well as the feedback section just referenced. A select A line 88 is connected to one input of a NAND gate 90 having its other input connected to a clock lead 92. A select B line 94 is connected to a first input of a NAND gate 96 having its second input connected to clock lead 92. A select C line 98 is connected to a first input of a NAND gate 100 having its second input connected to clock lead 92. An output of NAND gate 90 is connected to a lead 102 which is connected to the gate, lead or control means of each of transistors 54, 62, 68 and 60. An output of NAND gate 96 is connected to lead 104 which is connected to the control means or gate lead of transistors 52, 64, 58 and 70. An output of NAND gate 100 is connected to a lead 106 which is connected to the gate lead or control means of transistors 50 and 66 as well as being connected to the gate lead or control means of gating means 72 and 56. The transistors 68 through 72 are connected in series between the master stage of the master/slave flip flop and a junction point 108 and comprise a part of the input section for to an inverter 110 in the slave stage which has its output connected to a lead 112. Lead 112 is the Q output of the master/slave flip flop. An inverter 114 is connected between lead 112 and a junction point 116. The three transistors 56 through 60 are connected in parallel in the feedback section of the slave stage between junction point 116 and 108. The inverters 110 and 114 in combination with the feedback transistors 56 through 60 and the input section including transistors 68 to 72 comprise the slave stage of the master/slave flip flop.

As defined in the present application, the term "set" may be either a set of transistors in a common section such as the input section or in other words FETs 50 through 54 of FIG. 2 or the set may be all the transistors actuated by a single select line such as select line 102. In this case the set of transistors would be transistors or gating means such as 54, 60, 62 and 68 which control the passage of the data line input signal on lead 80 being passed to output 112. In this situation, one transistor from each section is selected to actuate the master and slave sections of the flip flop to output the selected input signal.

OPERATION

The PRIOR ART circuit of FIG. 1 is the traditional way of implementing a multiple input flip flop in CMOS technology. In this circuit the multiplexer 10 uses a select line 12 to select one of the inputs D0 through D2 to become the input of lead 14 to a standard master-/slave flip flop. This circuit uses a set of select lines 12 and a clock line 18 which signal must be delayed to correspond with delays in the multiplexer 10 to provide control. In some situations, it is more desirable to select between a plurality of clock signals as occurs in the present invention.

Although it is believed that the operation of a master/slave flip flop is well known, a brief synopsis will be provided of the operation of same. Once a signal is selected and input on lead 14, it encounters a normally open switch shown as P channel transistor 22. Within the flip flop 16, transistor 42 is also normally opened and transistors or gating means 26 and 34 are normally closed. When the clock signal on lead 18 activates gating means 22, it simultaneously turns transistor 42 ON also while at the same time turning transistors 26 and 34 OFF. With transistor 22 ON, the data input signal is supplied to inverter 30 and output to junction point 32 as well as being passed through inverter 28 so that it is at the output of inverter 28. Since gating means 26 is OFF, the signal can go no further. Also, since gating means 34 is opened at this point in time it cannot be passed to the slave stage. Once the clock on lead 46 reverts to its normal condition, transistors 22 and 42 again return to an open condition and transistors 26 and 34 close. Thus, the logic value of the input signal appears in inverted format at junction point 32 and is inverted again so that it appears as the Q output at lead 40. Since transistor 26 is now closed, the inversion of the signal at 32 is again inverted in 28 and returned to the input of 30 in a feedback manner to maintain the master stage signal until a further input is provided. Since it is maintained in the master stage through feedback action, it is also maintained through the normally closed switch 34 to the input of inverter 38 and thus at the output on lead 40. In this manner, the first set of inverters 30 and 28 constitute a master stage which maintains the last provided input. The slave stage comprises transistors 34 and 42 along with its inverters 38 and 44 which after the disappearance of the clocking control signal on lead 46 assumes the logic value of the signal most recently input to the master stage. When a new signal is input on lead 14, combined with the appearance of a clock on lead 46, the new signal is stored within the master stage and the slave stage maintains the previous logic value until the clock signal reverts to normal and at this time the slave stage receives the logic value of the most recently inputted signal and output this logic value.

The operation of FIG. 2 is extremely similar to that of FIG. 1 since the various gates are multiplied times the number of inputs to be selected from with each input signal having its own set of gates. In other words, the set of gates for input D0 is gates 50, 56, 66 and 72. Similarily, the set of gates for the select A signal are gating means 54, 60, 62 and 68.

It may be assumed that it is desired that the D1 signal be selected and passed to the output. In this case the NAND gate 96 is actuated by the select line 94 and the next time that a clock occurs, the NAND gate 96 outputs a logic 0 signal on lead 104 which will close gates 52 and 58 while opening gates 64 and 70 so that the logic value of the signal appearing on lead 78 is passed to the master stage and accordingly appears in inverted format at junction point 84 and in the correct format at the output of inverter 86. When the clock signal returns to the normal value, gates 52 and 58 again assume an open condition the same as the other gates in the master stage input and the slave stage feedback sections. The gates 64 and 70 assume a closed condition which is the same as the remaining gates in the master stage feedback section and the input section of the slave stage so that the signal most recently input from line 78 is passed to the Q output 112 via inverter 110 and maintained in the master stage through closure of all the transistors in the feedback section of the master stage. Likewise, since this logic value is maintained in the master stage, it is maintained at the output 112 through the gates 68 through 72 and the inverter 110. When the master/slave flip flop is actuated to receive the next signal, the appropriate transistor in the slave feedback section (one of 56 through 60) is turned to a closed or ON condition to maintain the previous logic value until the end of the actuating signal from NAND gates 90, 96 or 100.

In brief summation, all of the signals to be passed through the flip flop may or may not appear continuously on inputs D0 through D2 depending upon particular circuit requirements since the gating means 50 through 54 are normally open. Whenever it is desired to pass one of the controlled data signals inputs to output 112, one of the NAND gates is actuated through the appropriate select line and the next time the clock signal becomes a logic one, the output of that NAND gate is changed to a logic zero to actuate the gating means in the input of the master stage and the feedback section of the slave stage and to deactivate the gating means in the feedback section in the master stage and the input of the slave stage. This permits establishment of a given logic value in the master stage which is maintained after the NAND gate is deactivated through the removal of the appropriate select signal. When the select signal is removed, the output of a NAND gate is returned to a logic one and the normal conditions of the various gating means are reinstated so that the signal in the master stage is transmitted to the output 112 of the slave stage. Due to the feedback action in the slave stage, the slave stage maintains a signal until the end of the next clock signal inputting a new data signal to the master stage.

Although three data signals are illustrated as controlled by three control signals from select A through select C, the invention is applicable to any multiple number of data signal inputs. Further, the active state of the clock signals can be altered by changing the sense of the gating means to opposite polarity types. Further, while CMOS FET's are illustrated as the gating means, any other type of gating means such as relays or mechanical switches may be used to practice the invention.

It is my belief that the concept of the multiple input-/multiple clock master/slave flip flop illustrated in FIG. 2 is novel and original and I wish to be limited not by the particular configuration illustrated but only by the scope of the appended claims, wherein I claim:

1. A multiple input master/slave flip flop comprising, in combination:
   a plurality n of data signal means from which one is to be selected to actuate said flip flop;
   a plurality n of control lead means for normally supplying signals of a first logic value, the logic value of one of said control lead means changing to a second logic value to select a corresponding data signal means;
   master/slave flip flop means comprising,
      master stage means including, input means, output means and feedback means, and
      slave stage means including input means, output means and feedback means;
   a first plurality n of normally open gating means, each including control means, connected in parallel between corresponding ones of said plurality of data signal means and said input means of said master stage means;
   a second plurality n of normally closed gating means, each including control means, connected in series between said output means of said master stage means and said input means of said slave stage means;
   a third plurality n of normally closed gating means connected in series in said feedback means of said master stage means, each of said third plurality of normally closed gating means including control means;
   a fourth plurality of normally opened gating means, each including control means, connected in parallel in said feedback means of said slave stage means for providing a plurality n of possible feedback paths for said slave stage means; and
   means connecting said plurality n of control lead means to corresponding ones of said control means of said first, second, third and fourth plurality of normally open and normally closed gating means, said gating means being actuated to a condition opposite said normal condition when a signal of said second logic value is received by the control means of a given gating means.

2. Apparatus for selecting between multiple input data lines to actuate a master/slave flip flop comprising, in combination:
   first sets of gating means each including four gating means for each of a plurality of data signals to be controlled;
   one gating means of each said first sets connected in parallel to an input of a master stage of a master/slave flip flop;
   another of said gating means of each of said first sets connected in series in the feedback of the master stage of said master/slave flip flop;
   the third gating means of each of said first sets connected in series between the master stage and the slave stage of said master/slave flip flop;
   the fourth gating means of each of said first sets connected in parallel in the feedback section of said slave stage of said master/slave flip flop; and
   means for actuating each set of said four gating means corresponding to a given data signal when that data signal is to be output by said flip flop.

3. Apparatus as claimed in claim 2 wherein:
   said one gating means of each of said first sets is normally open;
   said another of said gating means of each of said first sets is normally closed;
   said third gating means of each of said first sets is normally closed, and
   said fourth gating means of each of said first sets is normally open.

4. The method of selecting one of a plurality n of data inputs to be applied to a master stage/slave stage flip flop wherein each stage includes feedback means and 2n gating means comprising the steps of:
   generating a control signal on one of a plurality of gate control data signal selection leads; and
   simultaneously actuating,
      one of n parallel connected normally open data input gating means,
      one of n serial connected normally closed gating means between master and slave stages of said master/slave flip flop,
      one of n serial connected normally closed gating means in the feedback means of said master stage, and
      one of n parallel connected normally open gating means in the feedback means of said slave stage.

5. The method of multiplexing one of a plurality of signals through a master/slave flip flop including gating means in the input sections and feedback sections of each of the master and slave stages comprising the steps of:
   parallel gating each of n signals to be multiplexed at the input section of the master stage and the feedback section of the slave stage; and
   serial gating each of n signals to be multiplexed in the input section of the slave stage and in the feedback section of said master stage.

6. Apparatus for selecting one of a plurality n of data inputs to be applied to a master stage/slave stage flip flop comprising, in combination:
   master stage/slave stage flip flop means,
      said master stage including feedback means and 2n gating means, and
      slave stage means including feedback means and 2n gating means;
   n control signal means, only one of which supplies a control signal at a given time;
   n parallel connected normally open input first set of gating means connected to said master stage for supplying data input signals thereto;
   n serially connected normally closed second set of gating means connected between said master and slave stages;
   n serially connected normally closed third set of gating means in said feedback means of said master stage;
   n parallel connected normally open fourth set of gating means connected in said feedback means of said slave stage; and
   means for connecting said n control leads to corresponding one of each of said sets of n gating means for simultaneously actuating one of said gating means in each of said sets whereby the selected data signal is output by said slave stage of said flip flop.

7. Apparatus for selecting between multiple input data lines to actuate a master/slave flip flop comprising, in combination:
   a set of four gating means for each of n data signals to be controlled;
   means for providing n data signals to be controlled;

master flip flop means including,
- a master stage having input output and feedback sections, and
- slave stage means including input, output, and feedback sections;

means for connecting one of said four gating means of each set in parallel between said means for supplying data signals to be controlled and said input of said master stage of said master/slave flip flop;

means for connecting a second gate from each set of gating means in series in the feedback section of the master stage of said master/slave flip flop means;

means connecting a third gating means of each set of gating means in series between the output of said master stage and the input of said slave stage of said master/slave flip flop; and means connecting a fourth gating means of each of said sets of gating means in parallel in the feedback section of said slave stage; and means for supplying control signals to each of said gating means so that only one set of n sets of gating means are actuated at any given time.

8. Apparatus for implementing a n input master/slave flip flop comprising, in combination:

a master/slave flip flop comprising master and slave stages with each stage having input, output and feedback sections;

means for providing n separate control signals;

means for supplying n different data signals to be controlled;

n sets of four gating means per set;

means connecting the first gating means of each of n sets in parallel between said means for supplying signals to be controlled and said input section of said master stage;

means for connecting the second gating means of each of said n sets in series between said output section of said master stage and said input section of said slave stage;

means for connecting the third gating means of each of said n sets in series in the feedback section of said master stage;

means for connecting the fourth gating means of each of said n sets in parallel in the feedback section of said slave stage; and means for connecting each of said n separate control signal means to corresponding gating means of each set for selecting specific data lines to be used to actuate said flip flop.

* * * * *